US010879853B2

(12) United States Patent
Jo et al.

(10) Patent No.: US 10,879,853 B2
(45) Date of Patent: Dec. 29, 2020

(54) BIAS CIRCUIT AND POWER AMPLIFIER FOR IMPROVING LINEARITY

(71) Applicant: Samsung Electro-Mechanics Co., Ltd., Suwon-si (KR)

(72) Inventors: Byeong Hak Jo, Suwon-si (KR); Jong Ok Ha, Suwon-si (KR); Young Wong Jang, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 29 days.

(21) Appl. No.: 16/239,735

(22) Filed: Jan. 4, 2019

(65) Prior Publication Data
US 2020/0059202 A1    Feb. 20, 2020

(30) Foreign Application Priority Data

Aug. 16, 2018 (KR) .......................... 10-2018-0095546

(51) Int. Cl.
| | |
|---|---|
| *H03F 3/04* | (2006.01) |
| *H03F 1/30* | (2006.01) |
| *H03F 3/217* | (2006.01) |
| *H03F 1/02* | (2006.01) |

(52) U.S. Cl.
CPC .......... *H03F 1/304* (2013.01); *H03F 1/0222* (2013.01); *H03F 1/305* (2013.01); *H03F 3/2178* (2013.01);

(Continued)

(58) Field of Classification Search
CPC . H03F 1/0211; H03F 1/32; H03F 3/21; H03F 3/19; H03F 2200/267;

(Continued)

(56) References Cited

U.S. PATENT DOCUMENTS

| | | | |
|---|---|---|---|
| 6,087,813 A | 7/2000 | Tobita | |
| 7,038,546 B2 * | 5/2006 | Kuriyama | ............ H03G 1/0082 330/133 |

(Continued)

FOREIGN PATENT DOCUMENTS

| | | |
|---|---|---|
| JP | 2000-155617 A | 6/2000 |
| JP | 2004-297277 A | 10/2004 |

(Continued)

OTHER PUBLICATIONS

Japanese Office Action dated Nov. 26, 2019 in corresponding Japanese Patent Application No. 2019-007978 (5 pages in English, 2 pages in Japanese).

*Primary Examiner* — Khanh V Nguyen
(74) *Attorney, Agent, or Firm* — NSIP Law

(57) ABSTRACT

A bias circuit includes a current source to generate a reference current, a temperature compensation portion in an off-state in an initial start period in response to a first control signal, and in an on-state in a normal driving period, subsequent to the initial start period, and to receive a first current of the reference current, and a bias output portion to generate a warm up current based on the reference current in the initial start period and to generate a bias current based on a second current, which is lower than the reference current by an amount of the first current, in the normal driving period.

9 Claims, 13 Drawing Sheets

(52) U.S. Cl.
CPC ........ *H03F 1/302* (2013.01); *H03F 2200/447* (2013.01)

(58) Field of Classification Search
CPC ............. H03F 2200/451; H03F 1/0261; H03F 2200/18; H03F 1/304; H03F 3/2178; H03F 1/0222; H03F 1/305; H03F 2200/447; H03F 3/191; H03F 1/302; H03F 1/30
USPC ......................................... 330/285, 289, 296
See application file for complete search history.

(56) References Cited

U.S. PATENT DOCUMENTS

| | | | |
|---|---|---|---|
| 8,040,186 B2* | 10/2011 | Nakayama | H03F 3/189 330/133 |
| 9,628,029 B2 | 4/2017 | Huang et al. | |
| 9,647,700 B2* | 5/2017 | Hase | H03F 1/56 |
| 9,692,370 B2* | 6/2017 | Chiu | H03F 3/21 |
| 10,547,307 B2* | 1/2020 | Won | H03F 3/245 |
| 2011/0175681 A1* | 7/2011 | Inamori | H03F 1/0211 330/296 |
| 2011/0187459 A1 | 8/2011 | Matsuzuka et al. | |
| 2013/0034144 A1 | 2/2013 | Doherty et al. | |
| 2013/0293311 A1 | 11/2013 | Wakita et al. | |
| 2016/0353394 A1 | 12/2016 | Tadano | |
| 2018/0083581 A1 | 3/2018 | Ishihara et al. | |

FOREIGN PATENT DOCUMENTS

| | | |
|---|---|---|
| JP | 2011-160256 A | 8/2011 |
| JP | 2016-225887 A | 12/2016 |
| JP | 2018-050200 A | 3/2018 |
| WO | WO 2012/111274 A1 | 8/2012 |

\* cited by examiner

BIAS CIRCUIT AND POWER AMPLIFIER FOR IMPROVING LINEARITY

CROSS-REFERENCE TO RELATED APPLICATION

This application claims the benefit under 35 USC 119(a) to Korean Patent Application No. 10-2018-0095546 filed on Aug. 16, 2018 in the Korean Intellectual Property Office, the entire disclosure of which is incorporated herein by reference for all purposes.

BACKGROUND

1. Field

The following description relates to a bias circuit and a power amplifier for improving linearity.

2. Description of Background

Generally, a method of time division duplexing (TDD) and a method of frequency division duplexing (FDD) are used as wireless communication methods. Both methods are used to communicate with a greater number of users within limited sources. TDD is used to communicate with a plurality of users by dividing the time for which communication is performed by equal intervals in the same frequency, while FDD is used to communicate with users by allocating a different frequency to each user.

A common time division duplexing method is a method of communicating with a plurality of users by dividing the time for which communication is performed by equal intervals in the same frequency. In the common time division duplexing method, one frequency is used, and communications are performed in different periods of time. Accordingly, transmission and reception are repeatedly converted to each other during communication.

Accordingly, a high response speed of a transmitter and a receiver becomes an important factor of performance in communication based on a time division duplex method, and an amplifier circuit included in the transmitter and the receiver may also be required to have a high response speed.

However, to improve a response speed of a transmitter, it may be necessary to improve a response speed of a power amplifier provided in the transmitter. Particularly, the power amplifier may be required to reach a normal state swiftly within a short period of time when the power amplifier starts operating.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bias circuit includes a current source to generate a reference current, a temperature compensation portion in an off-state in an initial start period in response to a first control signal, and in an on-state in a normal driving period, subsequent to the initial start period, and to receive a first current of the reference current, and a bias output portion to generate a warm up current based on the reference current in the initial start period and to generate a bias current based on a second current, which is lower than the reference current by an amount of the first current, in the normal driving period.

The temperature compensation portion may include a temperature compensation circuit connected between a first node, an output stage of the current source, and a first ground, and may also include a first switch connected between the first node and the temperature compensation circuit. The first switch may be in an off-state in the initial start period in response to the first control signal and in an on-state in the normal driving period.

The temperature compensation portion may include a temperature compensation circuit connected between a first node, an output stage of the current source, and a first ground, and may also include a first switch connected between the temperature compensation circuit and the first ground. The first switch may be in an off-state in the initial start period in response to the first control signal and in an on-state in the normal driving period.

The bias output portion may include a bias output circuit connected between the first node and a power amplifier circuit, and may also include a second switch connected between the first node and the bias output circuit. The second switch may be in an on-state in the initial start period and in the normal driving period in response to a second control signal.

The bias output portion may include a bias output circuit connected between the first node and a power amplifier circuit, and may also include a second switch connected between the bias output circuit and the power amplifier circuit. The second switch may be in an on-state in the initial start period and in the normal driving period in response to a second control signal.

The bias output circuit may include a bias transistor including a base connected to the second switch, a collector connected to an operational voltage terminal, and an emitter connected to the power amplifier circuit. The bias transistor may generate the warm up current in the initial start period and generate the bias current in the normal driving period by amplifying a current input through the second switch, and may output the amplified current to an input node of the power amplifier circuit.

The first current may be input in the temperature compensation circuit in the normal driving period and the second current may be input in the bias output circuit in the normal driving period, and the first current may be higher than the second current.

In another general aspect, a power amplifier includes a bias circuit to generate a warm up current in an initial start period and to generate a bias current in a normal driving period, subsequent to the initial start period, and a power amplifier circuit to be warmed up by receiving the warm up current and to be driven by receiving the bias current. The bias circuit includes a current source to generate a reference voltage, a temperature compensation portion in an off-state in the initial start period and in an on-state in the normal driving period, a bias output portion to generate the warm up current based on the reference current in the initial start period and to generate the bias current based on a current, which is lower than the reference current, in the normal driving period.

The temperature compensation portion may include a temperature compensation circuit connected between a first node, an output stage of the current source, and a first ground, and may also include a first switch connected between the first node and the temperature compensation circuit. The first switch may be in an off-state in the initial start period in response to the first control signal and in an on-state in the normal driving period.

The temperature compensation portion may include a temperature compensation circuit connected between a first node, an output stage of the current source, and a first ground, and may also include a first switch connected between the temperature compensation circuit and the first ground. The first switch may be in an off-state in the initial start period in response to the first control signal and in an on-state in the normal driving period.

The bias output portion may include a bias output circuit connected between the first node and a power amplifier circuit, and may also include a second switch connected between the first node and the bias output circuit. The second switch may be in an on-state in the initial start period and in the normal driving period in response to a second control signal.

The bias output portion may include a bias output circuit connected between the first node and a power amplifier circuit, and may also include a second switch connected between the bias output circuit and the power amplifier circuit. The second switch may be in an on-state in the initial start period and in the normal driving period in response to a second control signal.

The bias output circuit may include a bias transistor including a base connected to the second switch, a collector connected to an operational voltage terminal, and an emitter connected to the power amplifier circuit, and the bias transistor may generate the warm up current in the initial start period and generate the bias current in the normal driving period by amplifying a current input through the second switch, and may output the amplified current to an input node of the power amplifier circuit.

The power amplifier may include a control circuit to output the first control signal based on a system enable signal, the first control signal may have a switching-on level in the initial start period, the control circuit may generate the second control signal, and the second control signal may have a switching-off level in the initial start period and a switching-on level in the normal driving period.

The control circuit may include a buffer to output a second control voltage based on the system enable signal, a constant current source to generate a constant current, a capacitor circuit to charge an electric charge based on the constant current and to output a charging voltage, and a comparator to compare the charging voltage and a reference voltage and to output the first control signal having a level depending on a result of the comparison.

The control circuit may include a first constant current source to generate a first constant current, a second constant current source to generate a second constant current, a first capacitor circuit to charge an electric charge based on the first constant current and to output a first charging voltage, a second capacitor circuit to charge an electric charge based on the second constant current and to output a second charging voltage, a discharge control circuit to compare the first charging voltage and a first reference voltage and to control an output shutdown and a discharge of the first constant current source and the second constant current source having a level depending on a result of the comparison of the first charging voltage and the first reference voltage, a discharge circuit to discharge the first capacitor circuit and the second capacitor circuit in response to a control of the discharge control circuit, a first comparison circuit to compare the first charging voltage and a second reference voltage and to output the first control signal having a level depending on a result of the comparison of the first charging voltage and the second reference voltage, and a second comparison circuit to compare the second charging voltage and the second reference voltage and to output the second control signal having a level depending on a result of the comparison of the second charging voltage and the second reference voltage.

In another general aspect, a bias circuit includes a bias transistor configured to receive a first current and a second current lower than the first current, to output a third current based on the first current in a first time period, and to output a fourth current based on the second current in a second time period subsequent to the first time period, the fourth current being lower than the third current.

A power amplifier may include the bias circuit and a power amplifier circuit to be warmed up in the first time period in response to receiving the third current and to be driven in the second time period in response to receiving the fourth current.

The bias circuit may include one or more diodes to receive a fifth current equal to the first current minus the second current.

The bias circuit may include one or more diode-connected transistors to receive a fifth current equal to the first current minus the second current.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
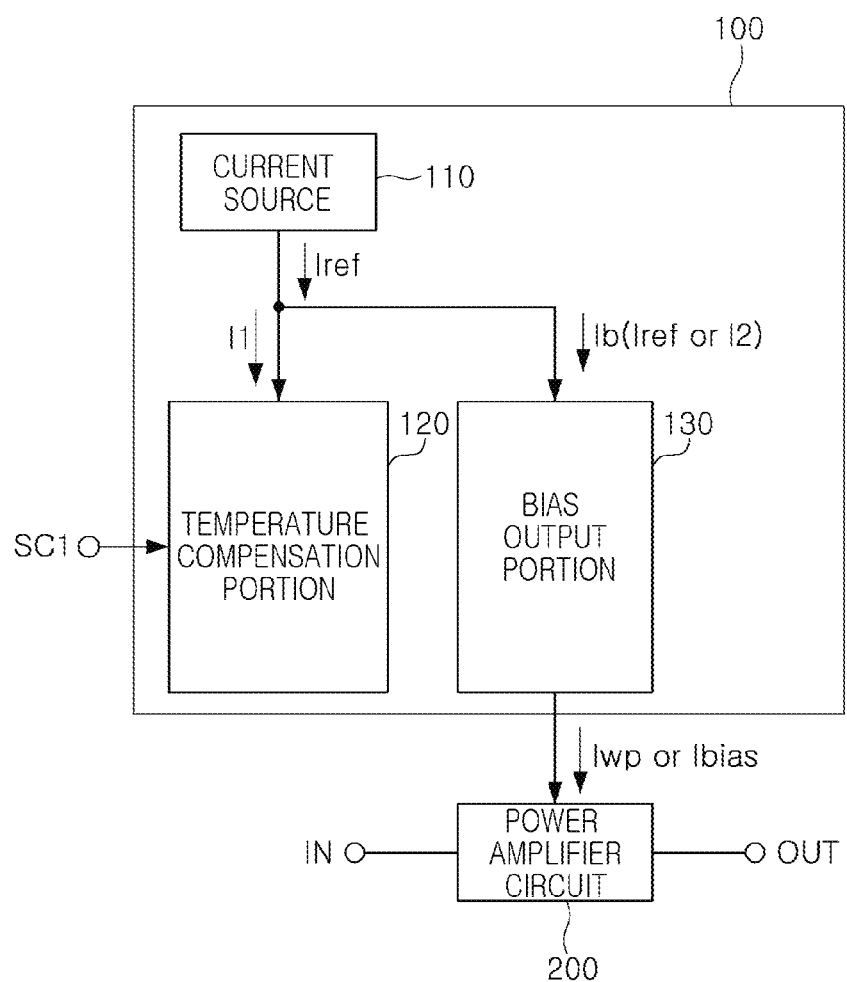
FIG. 1 is a diagram illustrating an example configuration of a bias circuit and a power amplifier.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
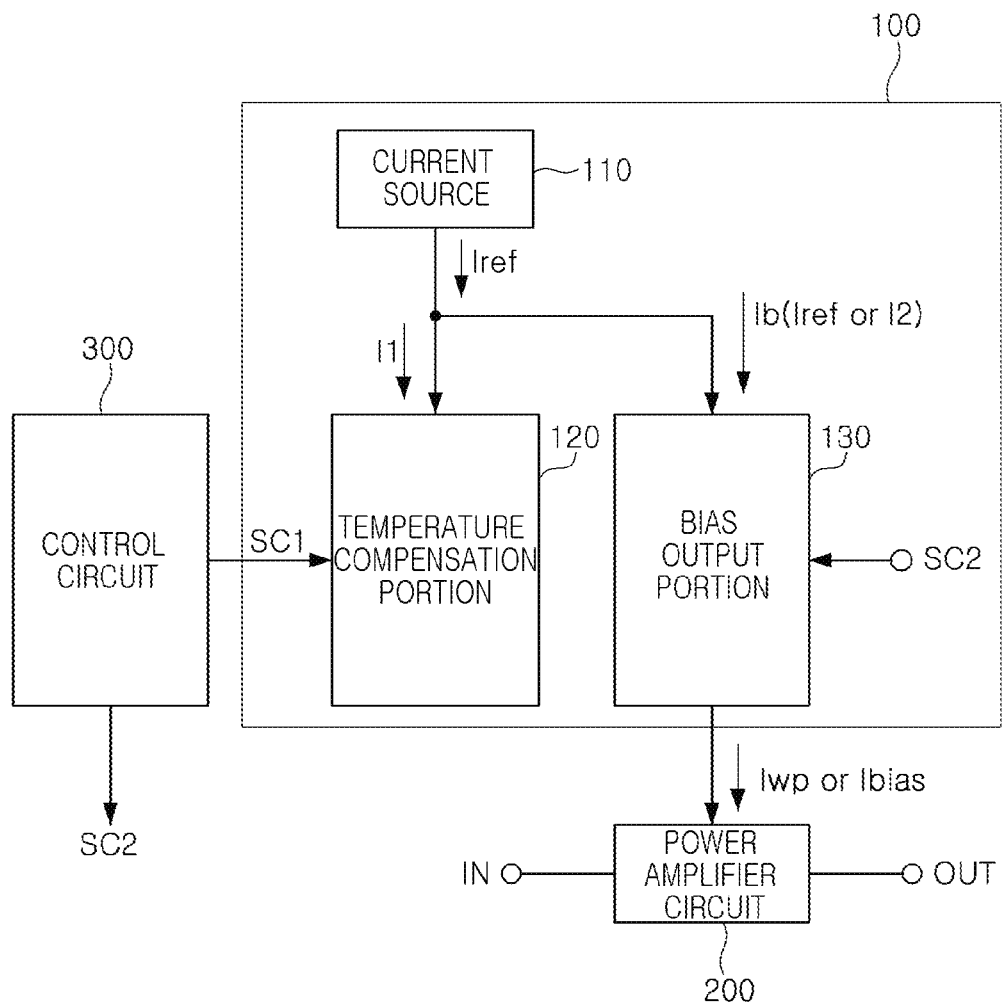
FIG. 2 is a diagram illustrating an example configuration of a bias circuit and a power amplifier.

FIG. 1 is a diagram illustrating an example configuration of a bias circuit and a power amplifier. FIG. 2 is a diagram illustrating an example configuration of a bias circuit and a power amplifier.

Referring to FIGS. 1 and 2, a power amplifier may include a bias circuit 100 and a power amplifier circuit 200.

The bias circuit 100 may generate a warm up current Iwp higher than a bias current Ibias in an initial start period PT1, and generate the bias current Ibias, lower than the warm up current Iwp, in a normal driving period PT2, subsequent to the initial start period PT1.

The power amplifier circuit 200 may be warmed up by receiving the warm up current Iwp in the initial start period PT1, and may be driven by receiving the bias current Ibias in the normal driving period PT2.

For example, the bias circuit 100 may include a current source 110, a temperature compensation portion 120 and a bias output portion 130.

The current source 110 may generate a reference current Iref.

The temperature compensation portion 120 may be in an off-state in the initial start period PT1, and may be in an on-state in the normal driving period PT2 and receive a first current of the reference current Iref. For example, the temperature compensation portion 120 may be in an off-state in the initial start period PT1 in response to a first control signal SC1, and may be in an on-state in the normal driving period PT2 subsequent to the initial start period PT1 and receive the first current I1 of the reference current Iref.

The bias output portion 130 may generate the warm up current Iwp in the initial start period PT1 based on the reference current Iref, and generate the bias current Ibias in the normal driving period PT2 based on a base current Ib lower than the reference current Iref, that is, based on a second current I2, lower than the reference current Iref by the first current I1. For example, the bias output portion 130 may receive the base current Ib from the current source 110, and the base current Ib may be the reference current Iref or the second current I2.

Referring to FIG. 2, the power amplifier may further include a control circuit 300. The control circuit 300 may output the first control signal SC1 having a switching-on level in the initial start period PT1, determined in advance, based on a system enable signal, and may generate a second control signal SC2 including a switching-off level in the initial start period PT1 and including a switching-on level in the normal driving period PT2.

For example, the first current I1 may be configured to be input in the temperature compensation portion 120 in the normal driving period PT2, and may be higher than the second current I2 input in bias output portion 130.

For example, in the case in which a current amplifier gain of the bias output portion 130 is 100, the reference current Iref is 100 μA, the first current I1 is 80 μA, and the second current I2 is 20 μA, the warm up current Iwp may become 10 mA, equal to one hundred times the reference current Iref (100 μA), and the bias current Ibias may become 2 mA, equal to one hundred times the second current I2 (20 μA).

For example, the temperature compensation portion 120 may operate in response to the first control signal SC1, and the bias output portion 130 may operate in response to the second control signal SC2. FIGS. 1 and 2 merely illustrate an example, and the power amplifier, bias circuit, power amplifier circuit, and control circuit are not limited to such configurations. Various configurations will be described in greater detail with reference to FIGS. 5 to 8 later.

In respect to the drawings, unnecessary overlapped descriptions of elements having the same reference numerals and functions will be omitted, and mainly, different features of the example in each diagram will be described.

Figure 3:
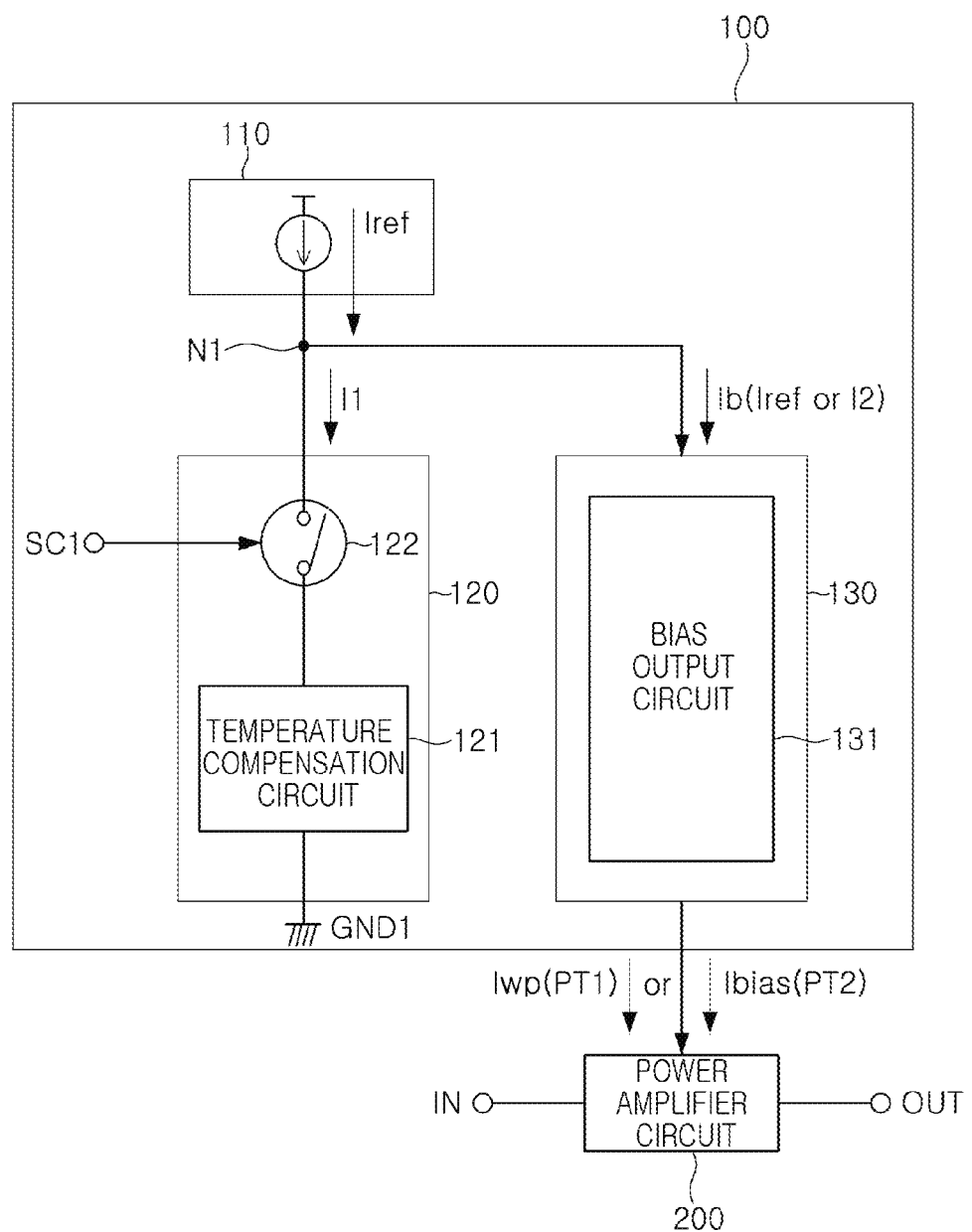
FIG. 3 is a diagram illustrating an example of a bias circuit.
Figure 4:
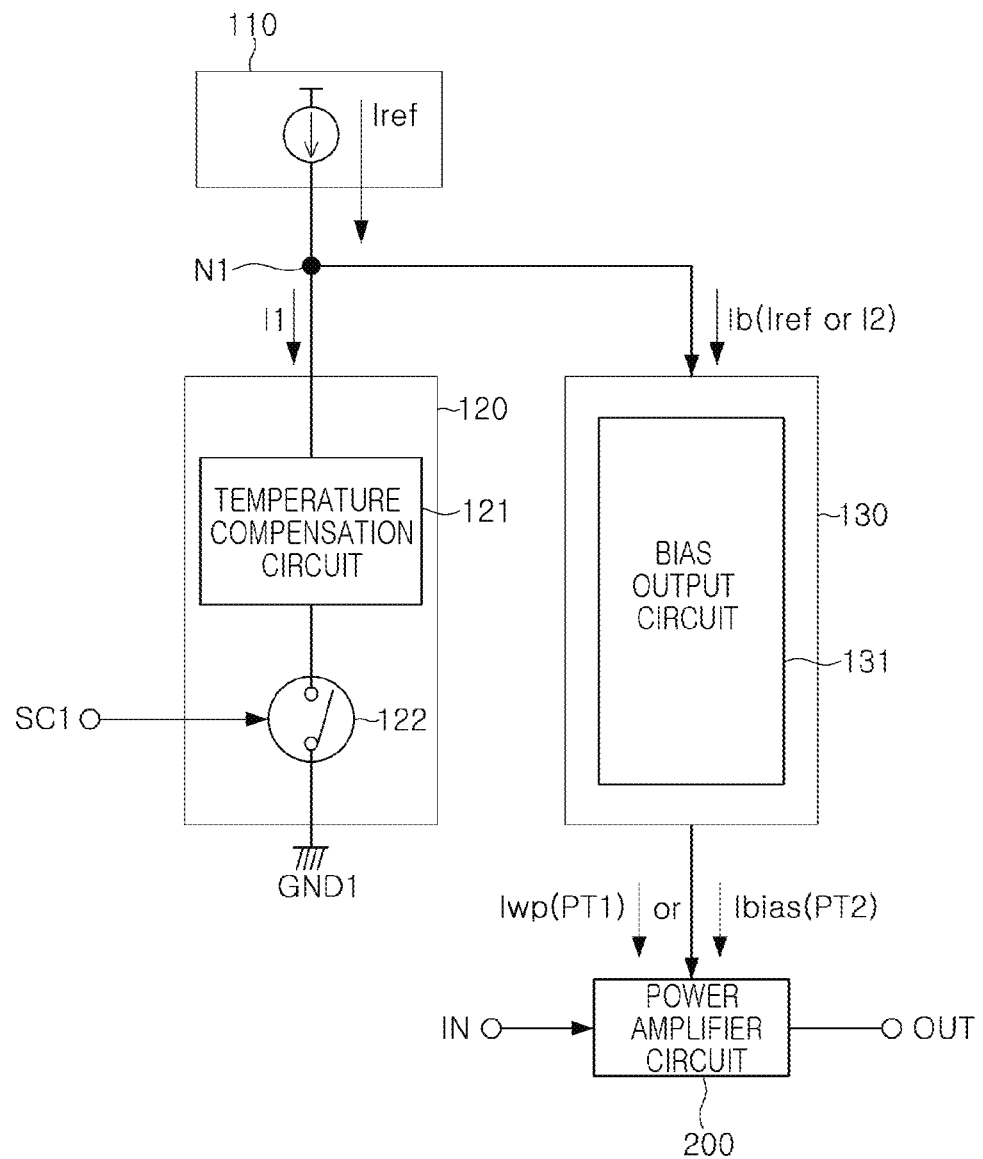
FIG. 4 is a diagram illustrating an example of a bias circuit.

FIG. 3 is a diagram illustrating an example of a bias circuit. FIG. 4 is a diagram illustrating an example of a bias circuit.

In the description below, examples of a temperature compensation portion 120 in a bias circuit 100 will be described with reference to FIGS. 3 and 4.

Referring to FIGS. 3 and 4, the temperature compensation portion 120 may include a temperature compensation circuit 121 and a first switch 122.

Referring to FIG. 3, the temperature compensation circuit 121 may be connected between a first node N1, an output stage of a current source 110, and a first ground GND1.

The first switch 122 may be connected between the first node N1 and the temperature compensation circuit 121, and may be in an off-state in an initial start period PT1 in response to the first control signal SC1, and shutdown current supplied to the temperature compensation circuit 121. The first switch 122 may be in an on-state in a normal driving period PT2 and allow current to be supplied to the temperature compensation circuit 121.

The temperature compensation circuit 121 may not operate when the first switch 122 is in an off-state, as the temperature compensation circuit 121 is not supplied with current, and when the first switch 122 is in an on-state, the temperature compensation circuit 121 may be supplied with a first current I1 from a reference current Iref and operate normally.

Referring to FIG. 4, the temperature compensation circuit 121 may be connected between the first node N1, an output stage of the current source 110, and the first ground GND1.

The first switch 122 may be connected between the temperature compensation circuit 121 and the first ground GND1, and may be in an off-state in the initial start period PT1 in response to the first control signal SC1 and shutdown current supplied to the temperature compensation circuit 121, and may be in an on-state in the normal driving period PT2 and allow current to be supplied to the temperature compensation circuit 121.

The temperature compensation circuit 121 may not operate when the first switch 122 is in an off-state, as the temperature compensation circuit 121 is not supplied with current, and when the first switch 122 is in an on-state, the temperature compensation circuit 121 may be supplied with the first current I1 from a reference current Iref and operate normally.

Referring to FIGS. 3 and 4, for example, the first switch 122 may include at least one switching device, such as an MOS transistor that can be switched on or off in response to the first control signal SC1.

Figure 5:
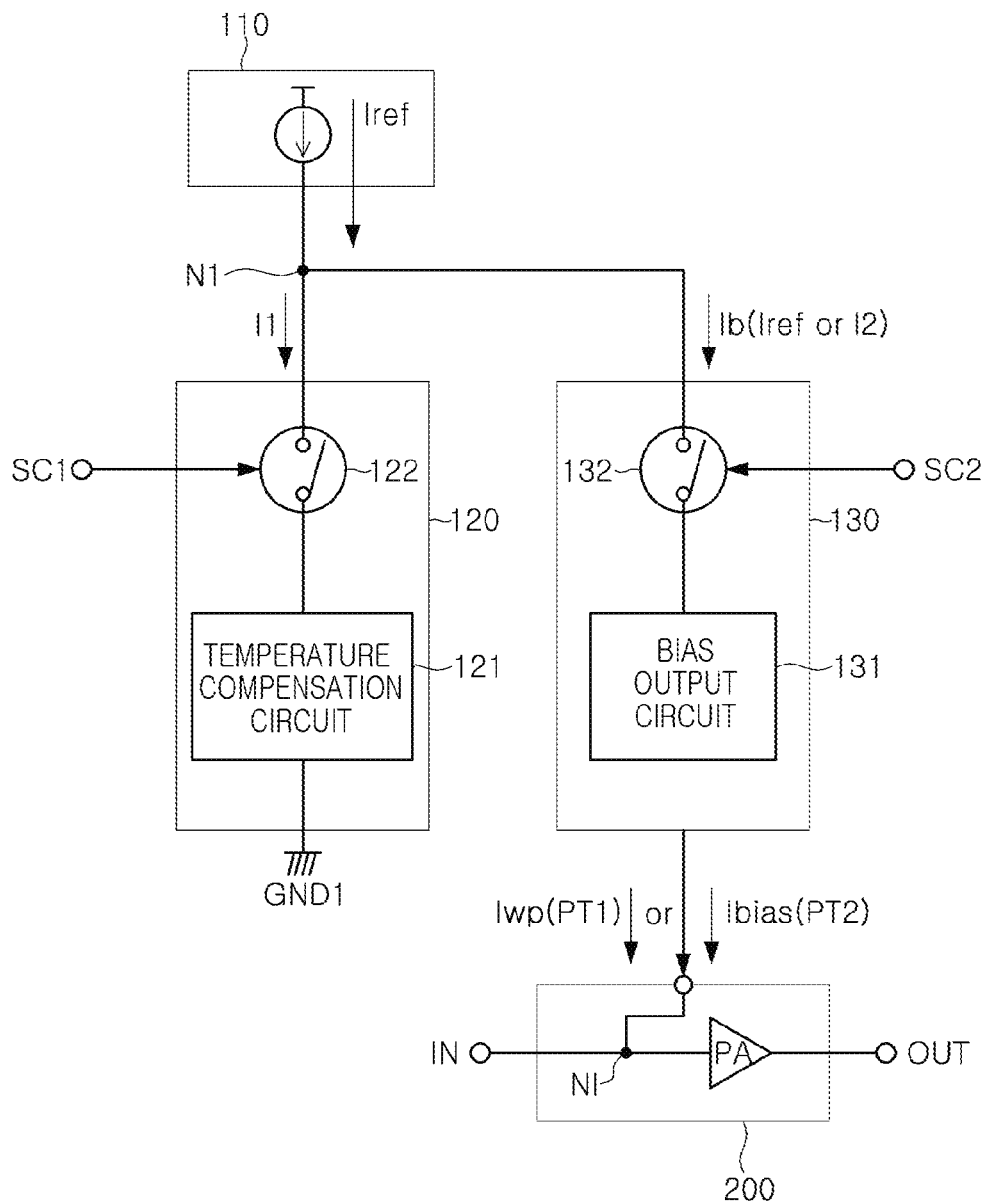
FIG. 5 is a diagram illustrating an example of a bias circuit.
Figure 6:
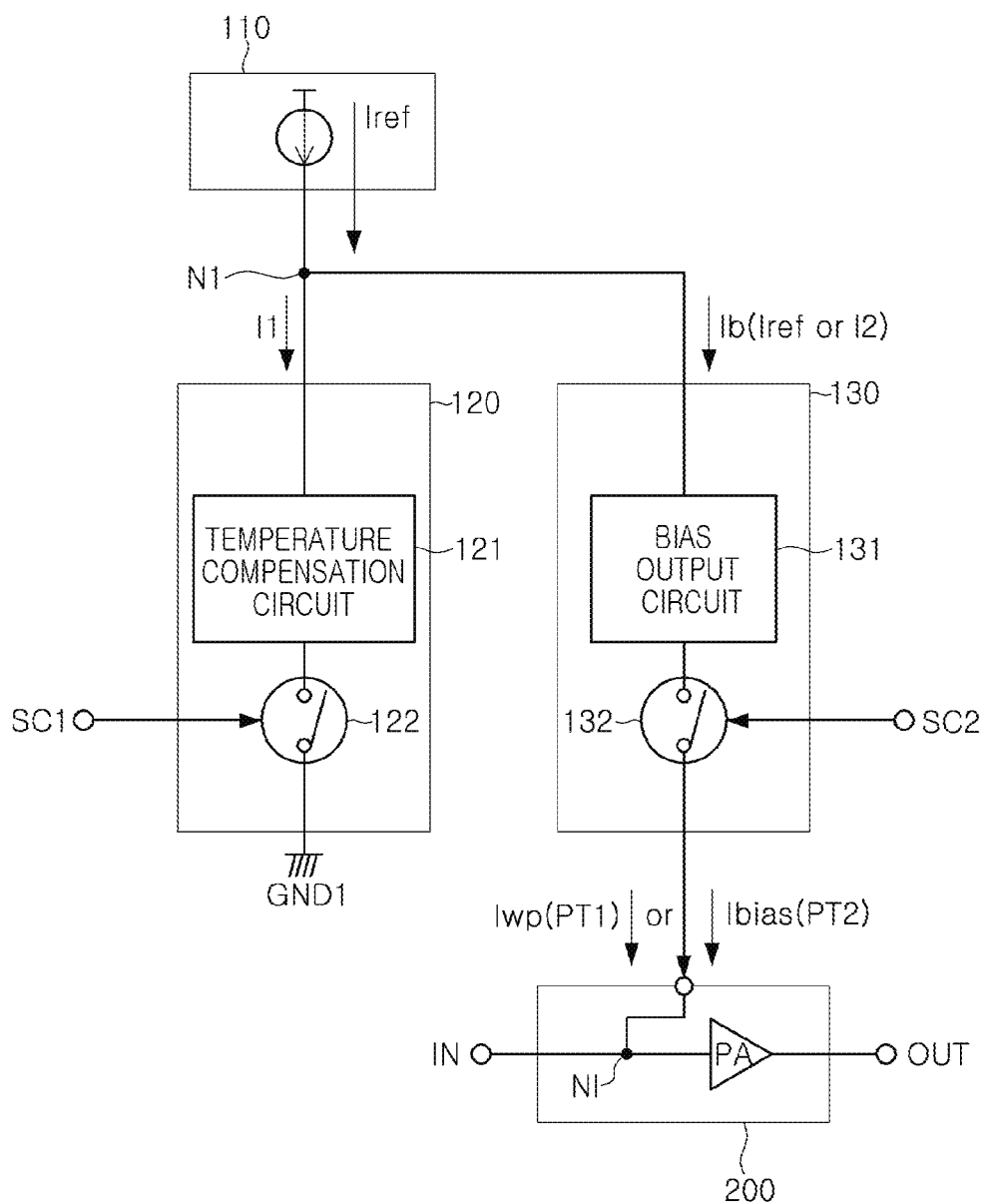
FIG. 6 is a diagram illustrating an example of a bias circuit.

FIG. 5 is a diagram illustrating an example of a bias circuit. FIG. 6 is a diagram illustrating an example of a bias circuit.

In the description below, examples of a bias output portion 130 in a bias circuit 100 will be described with reference to FIGS. 5 and 6.

The bias output portion 130 may include a bias output circuit 131 and a second switch 132.

Referring to FIG. 5, the bias output circuit 131 may be connected between a first node N1 and a power amplifier circuit 200.

The second switch 132 may be connected between the first node N1 and the bias output circuit 131, and may be in an on-state in an initial start period PT1 and in a normal driving period PT2 in response to a second control signal SC2.

Operation of the bias output portion 130 may be in an off-state when the second switch 132 is in an off-state, and when the second switch 132 is in an on-state, the bias output portion 130 may generate a warm up current Iwp or a bias current Ibias based on a reference current Iref or a second current I2.

Referring to FIG. 6, the bias output circuit 131 may be connected between the first node N1 and a power amplifier circuit 200.

The second switch 132 may be connected between the bias output circuit 131 and the power amplifier circuit 200, and may be in an on-state in the initial start period PT1 and in the normal driving period PT2.

Operation of the bias output portion 130 may be in an off-state when the second switch 132 is in an off-state, and when the second switch 132 is in an on-state, the bias output portion 130 may generate a warm up current Iwp or a bias current Ibias based on the reference current Iref or the second current I2.

Referring to FIGS. 5 and 6, for example, the second switch 132 may include at least one switching device, such as an MOS transistor that can be switched on or off in response to the second control signal SC2.

FIGS. 5 and 6 merely illustrate examples, and the present disclosure is not limited configurations.

Figure 7:
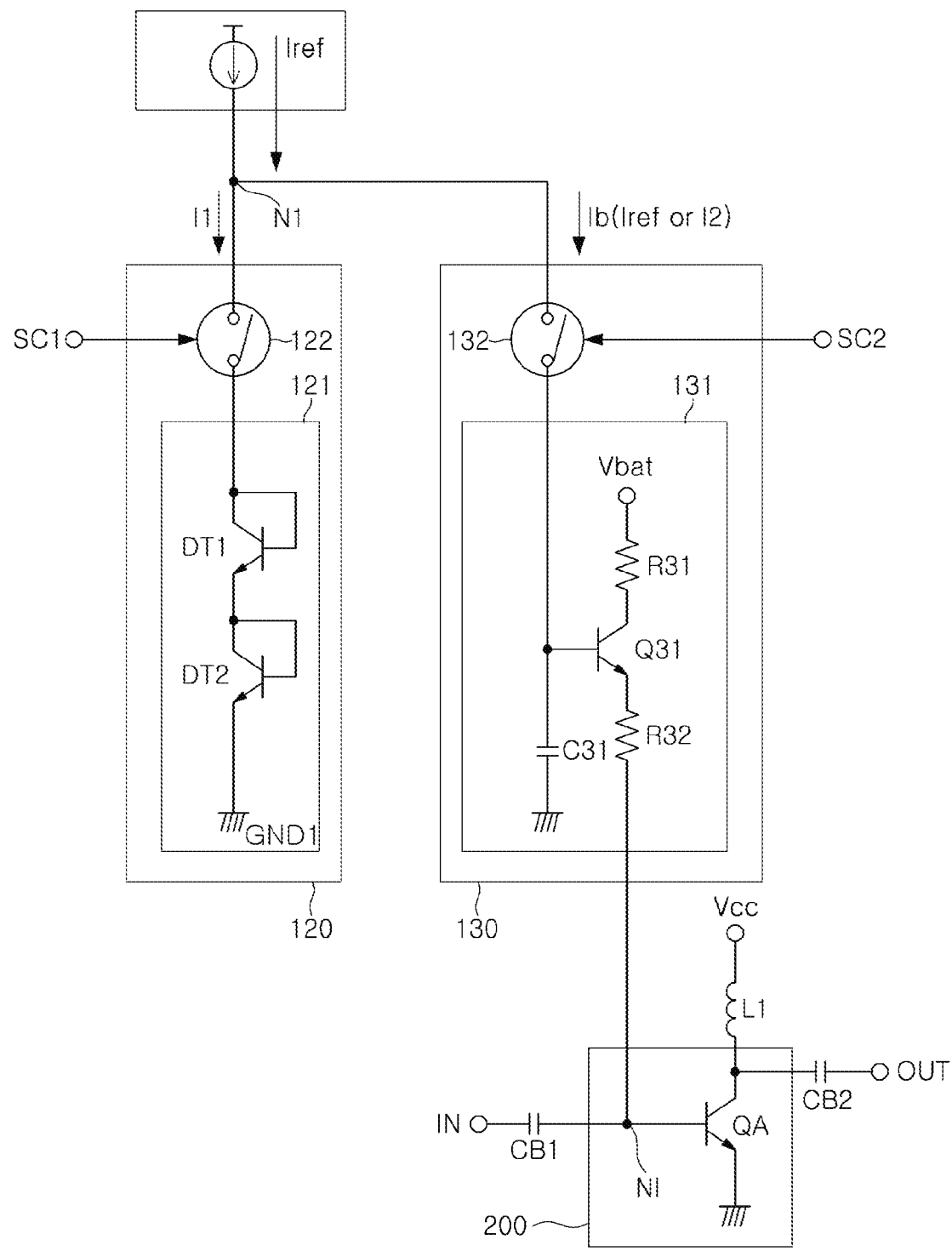
FIG. 7 is a diagram illustrating an example of a temperature compensation portion and a bias output portion.

FIG. 7 is a diagram illustrating an example of a temperature compensation portion 120 and a bias output portion 130.

Referring to FIG. 7, the temperature compensation portion 120 may include a temperature compensation circuit 121, which may include a plurality of diode-connected transistors DT1 and DT2 connected in series between a first switch 122 and a first ground GND1.

Figure 8:
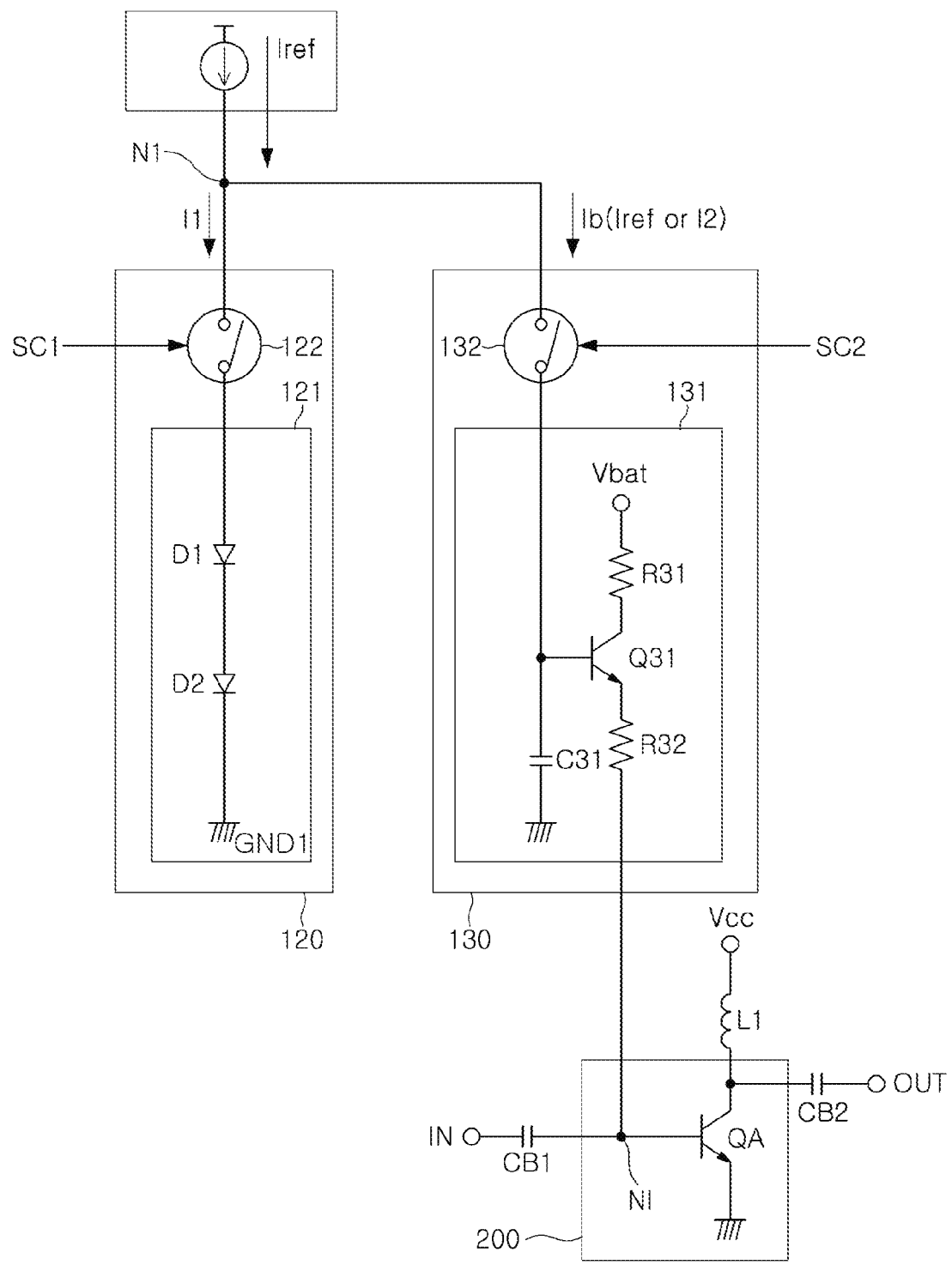
FIG. 8 is a diagram illustrating an example of a temperature compensation portion and a bias output portion.

FIG. 8 is a diagram illustrating an example of a temperature compensation portion 120 and a bias output portion 130.

Referring to FIG. 8, the temperature compensation portion 120 may include a temperature compensation circuit 121, which may include a plurality of diodes D1 and D2 connected in series between the first switch 122 and the first ground GND1.

Referring to FIGS. 7 and 8, the bias output portion 130 may include a bias output circuit 131, which may include a bias transistor Q31. The bias transistor Q31 may include a base connected to a second switch 132, a collector connected to an operational voltage Vbat terminal through a resistor R31, and an emitter connected to a power amplifier circuit 200 through a resistor R32.

The bias transistor Q31 may amplify a current input through the second switch 132 and output the amplified current to the power amplifier circuit 200.

For example, the bias transistor Q31 may amplify a reference current Iref input in an initial start period PT1 through the second switch 132 or a second current I2 input in a normal driving period PT2, generate a warm up current Iwp in the initial start period PT1 or generate a bias current Ibias in the normal driving period PT2, and output the amplified current to an input node NI of the power amplifier circuit 200. For example, a capacitor C31 may be connected between the base of the bias transistor Q31 and a ground for stable operation of the bias transistor Q31.

The power amplifier circuit 200 may include an amplifier transistor QA. The amplifier transistor QA may include a base connected to an input stage IN through a first blocking capacitor CB1, a collector connected to an operational voltage Vcc terminal through a coil L1 and connected to an output stage OUT through a second blocking capacitor CB2, and an emitter connected to a ground.

For example, the amplifier transistor QA may receive the warm up current Iwp through the base and be warmed up in the initial start period PT1.

The amplifier transistor QA may receive the bias current Ibias through the base in the normal driving period PT2, and may receive a signal, input through the input stage IN, through the base via the first blocking capacitor CB1, amplify the bias current Ibias and the signal, and output the amplified signal through the output stage OUT via the second blocking capacitor CB2.

The number of the plurality of diode-connected transistors DT1 and DT2 may be determined to compensate changes of the bias transistor Q31 and the amplifier transistor QA caused by temperature. The number of the plurality of diodes D1 and D2 may be determined to compensate changes of the bias transistor Q31 and the amplifier transistor QA caused by temperature.

Properties of the bias transistor Q31 and the amplifier transistor QA may change depending on temperature, and properties of the plurality of diode-connected transistors DT1 and DT2 and the plurality of diodes D1 and D2 may also change depending on temperature in the same direction as a direction of properties change of the bias transistor Q31 and the amplifier transistor QA. Thus, temperature compensation of the power amplifier may be achieved by the temperature compensation circuit 121.

Figure 9:
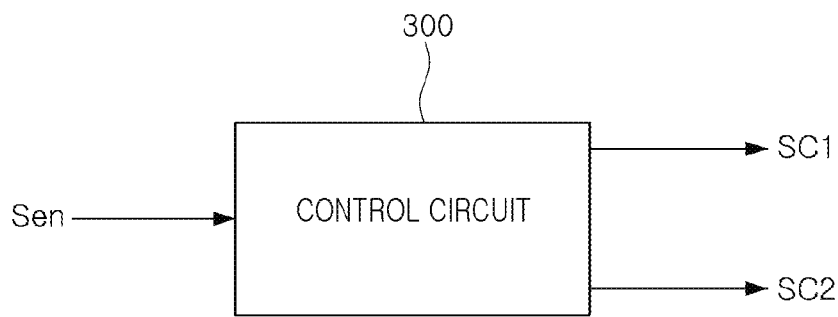
FIG. 9 is a diagram illustrating an example of a control circuit.

FIG. 9 is a diagram illustrating an example of a control circuit.

Referring to FIG. 9, a control circuit 300 may generate and output a first control signal SC1 having a switching-on level in an initial start period PT1, determined in advance, based on a system enable signal Sen.

The control circuit 300 may generate and output a second control signal SC2 including a switching-off level in the initial start period PT1 and including a switching-on level in a normal driving period PT2.

Figure 10:
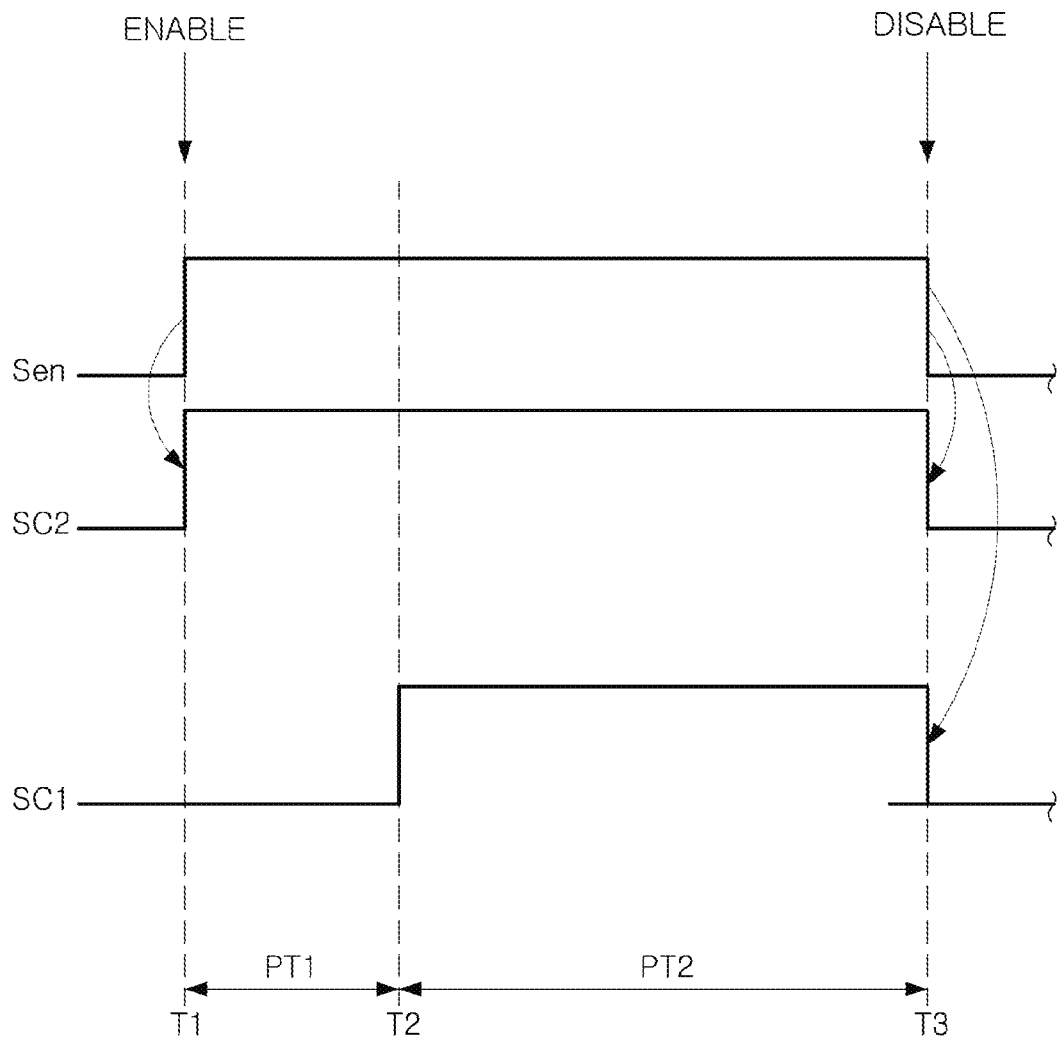
FIG. 10 is a diagram illustrating an example of a timing chart of a main signal of the control circuit illustrated in FIG. 9.

FIG. 10 is a diagram illustrating an example of a timing chart of a main signal of the control circuit in FIG. 9.

Referring to FIG. 10, the element "Sen" may be a system enable signal input in a control circuit 300. For example, the system enable signal Sen may be transited from a low level and to a high level when a system is enabled, and the system enable signal Sen may be transited from a high level to a low level when a system is disabled.

The element "SC2" may be a second control signal output from the control circuit 300. The second control signal SC2 may be synchronized to an ascent edge and a descent edge of the system enable signal Sen, and may go through an ascent transition T1 and a descent transition T3.

The element "SC1" may be a first control signal output from the control circuit 300. The first control signal SC1 may maintain a low level from the ascent edge of the system enable signal Sen, may go through a transition from a low level to a high level (T2) after an initial start period PT1, predetermined, and continuously maintain a high level until a system is disabled (T3). Once the system is disabled (T3), the first control signal SC1 may be transited from a high level to a low level.

Figure 11:
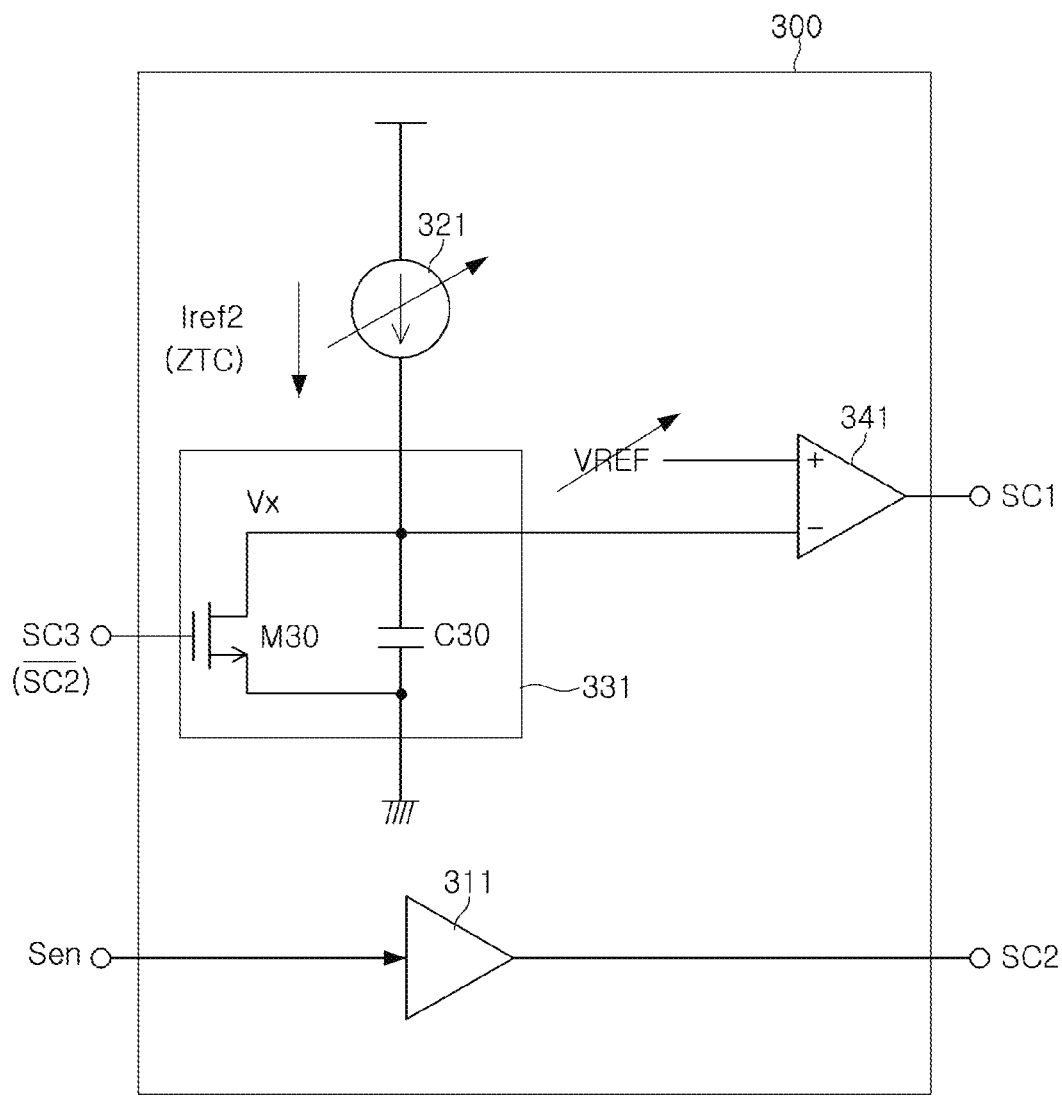
FIG. 11 is a diagram illustrating an example of the control circuit illustrated in FIG. 9.
Figure 12:
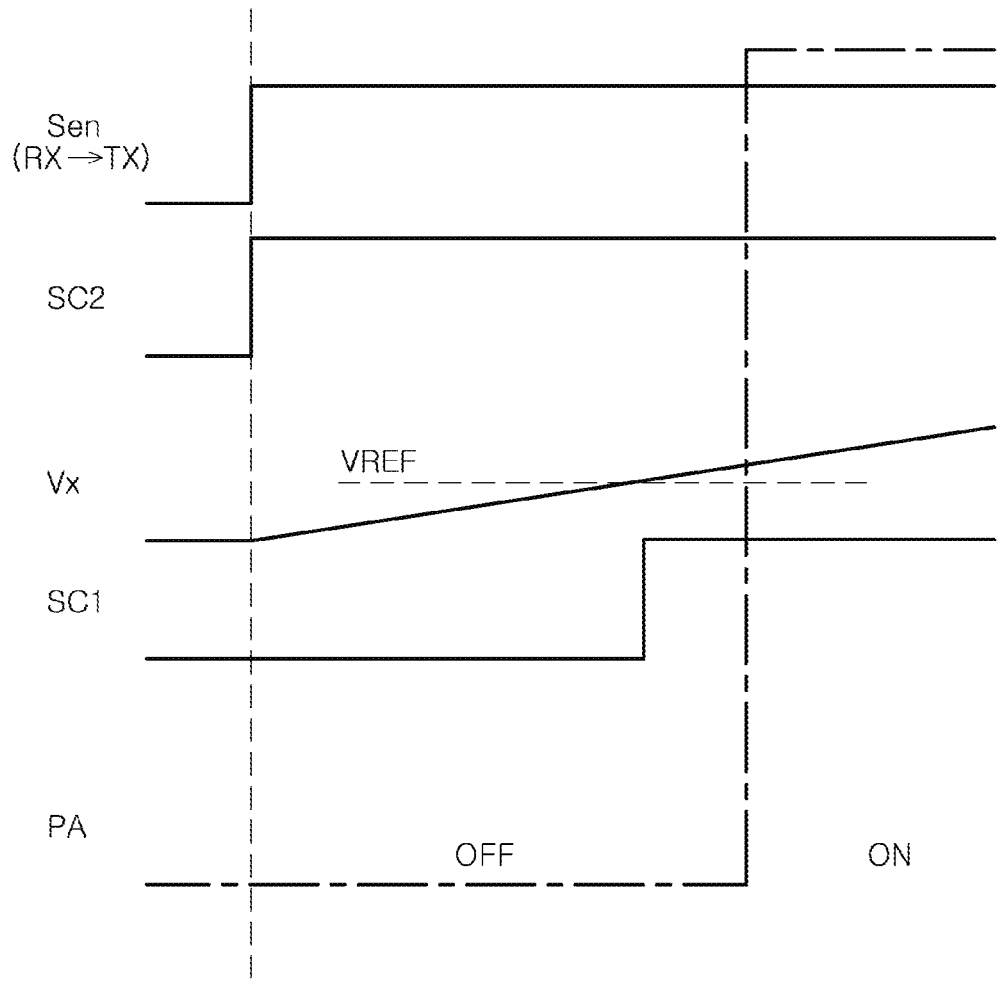
FIG. 12 is a diagram illustrating an example of a timing chart of a main signal and an operation of the control circuit illustrated in FIG. 11.

FIG. 11 is a diagram illustrating an example of a control circuit, such as the control circuit 300 in FIG. 9. FIG. 12 is a diagram illustrating an example of a timing chart of a main signal and an operation of the control circuit in FIG. 11.

Referring to FIGS. 11 and 12, the control circuit 300 may include a buffer 311, a constant current source 321, a capacitor circuit 331, and a comparator 341.

The buffer 311 may output a second control signal SC2 based on a system enable signal Sen.

The constant current source 321 may generate a constant current Iref2. For example, the constant current Iref2 may be configured to be variable depending on an external control.

The capacitor circuit 331 may charge an electric charge based on the constant current Iref2 and output a charging voltage Vx.

The comparator 341 may compare the charging voltage Vx and a reference voltage VREF and output a first control signal SC1 including a level depending on a result of the comparison. For example, the reference voltage VREF may be configured to be variable depending on an external change.

For example, the comparator 341 may output the first control signal SC1 including a low level when the charging voltage Vx is lower than the reference voltage VREF, and the comparator 341 may output the first control signal SC1 including a high level when the charging voltage Vx is higher than the reference voltage VREF.

A control circuit 200 illustrated in FIG. 11 may control the time of warm up accurately, but a process variation of a capacitor of the capacitor circuit 331 and an offset process variation of the comparator 341 may impede provision of an exact timing. To address the issue, a control circuit in FIG. 13 may be used.

Figure 13:
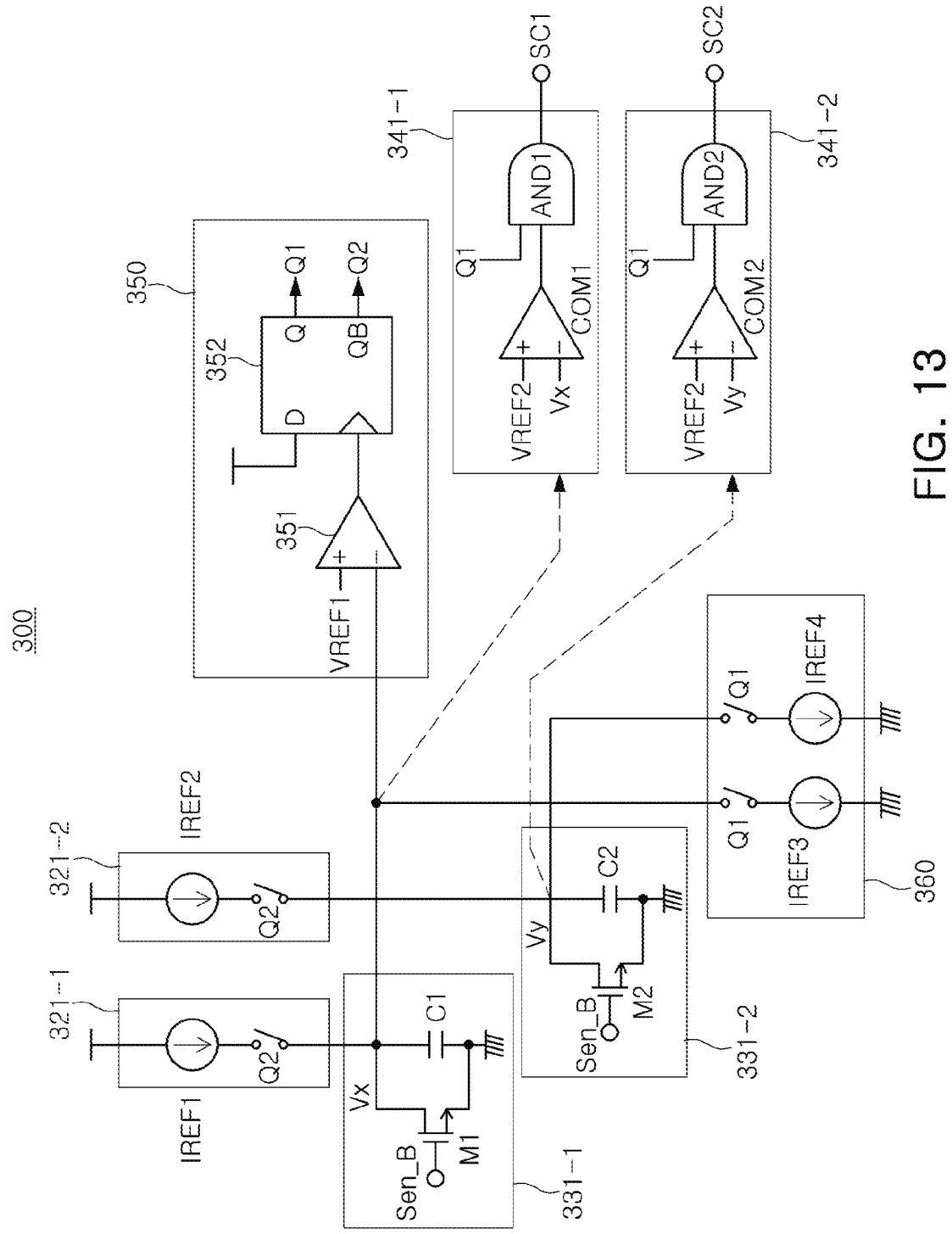
FIG. 13 is a diagram illustrating an example of the control circuit illustrated in FIG. 9.
Figure 14:
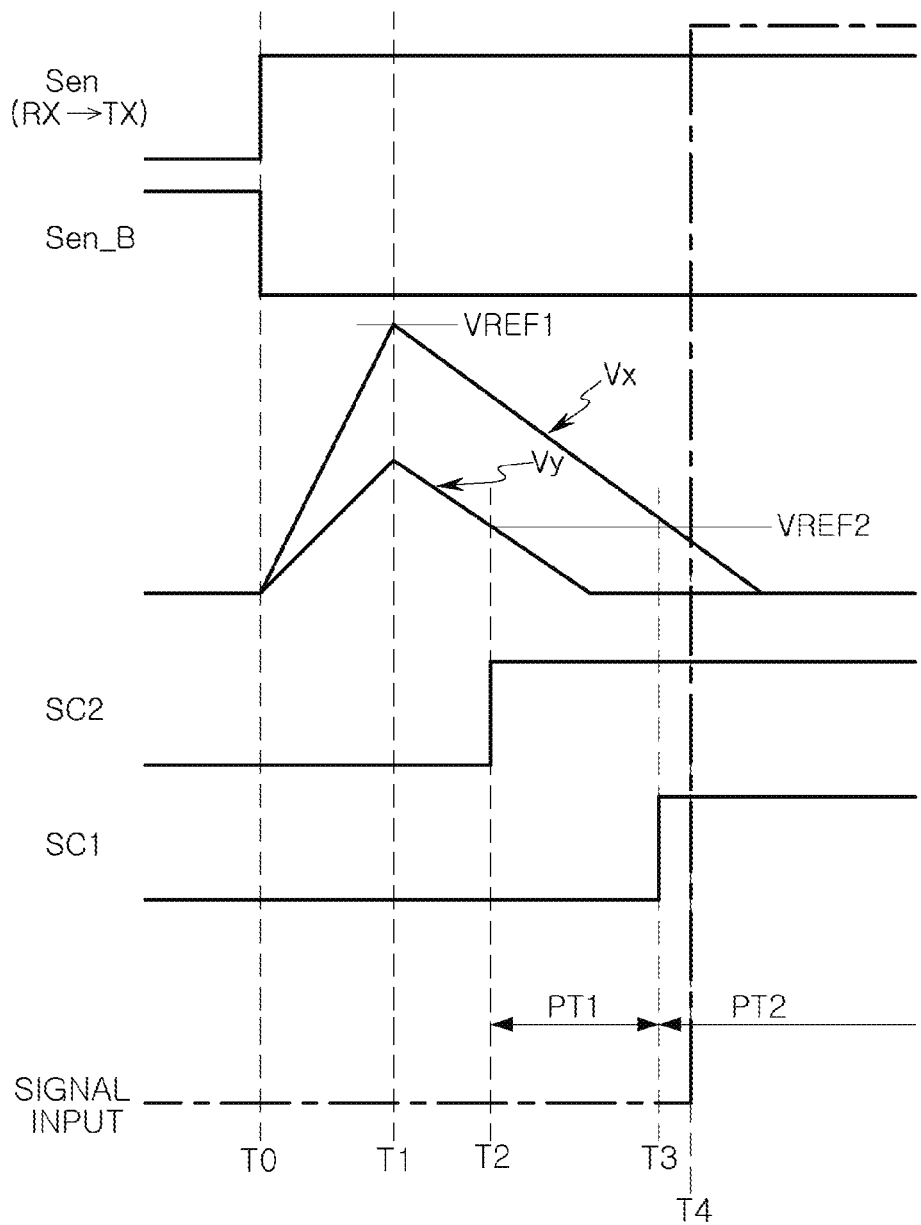
FIG. 14 is a diagram illustrating an example of a timing chart of a main signal and an operation of the control circuit illustrated in FIG. 13.

FIG. 13 is a diagram illustrating an example of a control circuit, such as the control circuit 300 in FIG. 9. FIG. 14 is a diagram illustrating an example of a timing chart of a main signal and an operation of the control circuit in FIG. 13.

Referring to FIG. 13, a control circuit 300 may include a first constant current source 321-1, a second constant current source 321-2, a first capacitor circuit 331-1, a second capacitor circuit 331-2, a discharge control circuit 350, a discharge circuit 360, a first comparison circuit 341-1, and a second comparison circuit 341-2.

The first constant current source 321-1 may be in a switched-on state or a switched-off state in response to a Q signal, and may generate and output a first constant current IREF1 in an on-state.

The second constant current source 321-2 may be in a switched-on state or a switched-off state in response to a Q signal, and may generate and output a second constant current IREF2 in an on-state.

For example, the first constant current IREF1 may be a current higher than the second constant current IREF2.

Accordingly, a slope of a first charging voltage Vx of a first capacitor circuit 331-1 may be greater than a slope of second charging voltage Vy of the second capacitor circuit 331-2.

The first capacitor circuit 331-1 may include a first capacitor C1 connected in parallel and a first switch device M1, and the first capacitor C1 may charge electric charge based on the first constant current IREF1 and output the first charging voltage Vx. The first switch device M1 may be in an off-state in a system enabled state in response to an inversion enable signal Sen_B, and be in an on-state in a system disabled state, and discharge the first charging voltage Vx charged on the first capacitor C1.

The second capacitor circuit 331-2 may include a second capacitor C2 connected in parallel and a second switch device M2, and the second capacitor C2 may charge an electric charge based on the second constant current IREF2 and output a second charging voltage Vy. The second switch device M2 may be in an off-state in a system enabled state in response to an inversion enable signal Sen_B, and be in an on-state in a system disabled state and discharge the second charging voltage Vy charged on the second capacitor C2.

The discharge control circuit 350 may compare the first charging voltage Vx and a first reference voltage VREF1, and control an output shutdown and a discharge of first and second constant current sources 321-1 and 321-2 including a level depending on a result of the comparison. For example, the discharge control circuit 350 may include a comparator 351 and a latch 352. The comparator 351 may compare the first charging voltage Vx and the first reference voltage VREF1, and in the case in which the first charging voltage Vx is lower than the first reference voltage VREF1, the comparator 351 may output a signal having a low level to the latch 352, and in the case in which the first charging voltage Vx is higher than the first reference voltage VREF1, the comparator 351 may output a signal having a high level to a clock terminal of the latch 352. The latch 352 may output a Q1 signal having a low level and a Q2 signal having a high level in the case in which a signal input in the clock terminal is a low level signal, and in the case in which a signal input in the clock terminal is a high level signal, the latch 352 may output a Q1 signal having a high level and a Q2 signal having a low level.

The discharge circuit 360 may discharge the first capacitor circuit 331-1 and the second capacitor circuit 331-2 in response to a control of the discharge control circuit 350. For example, the discharge circuit 360 may allow a third current IREF3 to flow to a ground in response to the Q1 signal to discharge the first charging voltage Vx of the first capacitor circuit 331-1, and may allow a fourth current IREF4 to flow to a ground in response to the Q1 signal to discharge the second charging voltage Vy of the second capacitor circuit 331-2.

For example, in the case in which the Q2 signal is a high level signal, a charging operation may be performed in the first capacitor circuit 331-1 and the second capacitor circuit 331-2, and in the case in which the Q1 signal is a high level signal, a discharging operation may be performed in the first capacitor circuit 331-1 and the second capacitor circuit 331-2 by the discharge circuit 360 configured to be in an on-state.

The second comparison circuit 341-2 may compare the second charging voltage Vy and a second reference voltage VREF2, and output the second control signal SC2 including a level depending on a result of the comparison.

For example, the second comparison circuit 341-2 may include a second comparator COM2 and a second AND gate AND2. The second comparator COM2 may compare the second charging voltage Vy and the second reference voltage VREF2, and output a signal that includes a low level in the case in which the second charging voltage Vy is higher than the second reference voltage VREF2, and that includes a high level in the case in which the second charging voltage Vy is lower than the second reference voltage VREF2, to the second AND gate AND2.

The second AND gate AND2 may logically multiply the Q1 signal by the output signal of the second comparator COM2, and in the case in which both the signals are high level signals, the second AND gate AND2 may output the second control signal SC2 having a high level.

The first comparison circuit 341-1 may compare the first charging voltage Vx and the second reference voltage VREF2 and output the first control signal SC1 including a level depending on a result of the comparison.

For example, the first comparison circuit 341-1 may include a first comparator COM1 and a first AND gate AND1. The first comparator COM1 may compare the first charging voltage Vx and the second reference voltage VREF2, and output a signal that includes a low level in the case in which the first charging voltage Vx is higher than the second reference voltage VREF2, and that includes a high level in the case in which the first charging voltage Vx is lower than the second reference voltage VREF2, to the first AND gate AND1.

The first AND gate AND1 may logically multiply the Q1 signal by the output signal of the first comparator COM1, and in the case in which both the signals are high level signals, the first AND gate AND1 may output the first control signal SC1 having a high level.

Referring to FIGS. 13 and 14, in the case in which the first capacitor C1 of the first capacitor circuit 331-1 and the second capacitor C2 of the second capacitor circuit 331-2 have the same level of capacitance, and the first constant current IREF1 is n times higher than the second constant current IREF2 (IREF1=n×IREF2), the first charging voltage Vx may increase faster than the second charging voltage Vy.

When the first charging voltage Vx or the second charging voltage Vy charged at the time T0 when an enable signal is transited to a high level reaches the first reference voltage VREF1 (T1), the Q2 signal may become an off-level signal, and the Q1 signal may become an on-level signal. Accordingly, electric charge charged in the first capacitor C1 and the second capacitor C2 may be discharged in a constant speed.

By discharging the electric charge as described above, the first control signal SC1 and the second control signal SC2 may be transited to an ascent level at the time T2 and T3 when the first charging voltage Vx and the second charging voltage Vy become equal to the level of the second reference voltage VREF2, respectively. At the time T2 when the second charging voltage Vy becomes equal to the second reference voltage VREF2, the second control signal SC2 may enter an on-level, and at the time T3 when the first charging voltage Vx becomes equal to the second reference voltage VREF2, the first control signal SC1 may enter an on-level. Consequently, the power amplifier may be warmed up during the time elapsed between the time T2 when the second control signal SC2 enters an on-level and the time T3 when first control signal SC1 enters an on-level.

Even in the case in which the first capacitor C1 and the second capacitor C2 change due to a process variation, the amount of change in ratio (C1/C2) between the first capacitor C1 and the second capacitor C2 may be significantly low. Thus, even though the time points T1, T2 and T3 may change upon a process variation of the capacitors and an offset of the comparators, the time of T3-T2 (corresponding to the initial start period PT1) may not significantly change. Accordingly, the time of a more stable initial start period PT1 may be obtained in relation to process voltage temperature.

In FIG. 14, the aforementioned time may be adjusted as intended by adjusting the first reference voltage VREF1 and the second reference voltage VREF2. Each of the first reference voltage VREF1 and the second reference voltage VREF2 may be a function of an operational voltage Vcc. For example, in the case in which the operational voltage Vcc is high, the level of warm up (Vcc×Iwp×time) corresponding to the initial start period PT1 may be adjusted to be constant by setting the level of the first reference voltage VREF1 to be low to reduce the time described above.

Further, in FIG. 14, the time may also be adjusted as intended by adjusting first to fourth reference voltages IREF1, IREF2, IREF3 and IREF4. For example, in the case in which the third reference voltage IREF3 is set to ¼ of the fourth reference voltage IREF4, the first charging voltage Vx may reduce four times more slowly than the second charging voltage Vy, and thus, it may be possible to increase the initial start period PT1 (T3-T2) four times.

In FIG. 14, the element "Sen" may be a system enable signal. For example, when a mode is changed from a receiving mode RX to a transmitting mode TX, the system enable signal Sen may be transited from a low level to a high level. "T0" indicates an enabling time, "T1" indicates a discharging time determined by the Q1 signal of the discharge control circuit 350, "T2" indicates an ascent time of the second control signal SC2 determined depending on an output signal of the second comparison circuit 341-2, "T3" indicates an ascent time of the second control signal SC2 determined depending on an output signal of the first comparison circuit 341-1, and "T4" indicates the time when a signal is input.

The control circuit of the power amplifier according to an example may be implemented in a computing environment in which a processor such as a central processing unit (CPU), a graphics processing unit (GPU), a microprocessor, an application specific integrated circuit (ASIC), a field programmable gate array (FPGA), and the like, a memory such as a volatile memory (e.g., a RAM, and the like) and a non-volatile memory (e.g., a ROM, a flash memory, and the like), an input device such as a keyboard, a mouse, a pen, a voice input device, a touch input device, an infrared camera, a video input device, and the like, an output device such as a display, a speaker, a printer, and the like, and a communication connection device such as a modem, a network interface card (NIC), an integrated network interface, a wireless frequency transmitter/receiver, an infrared port, a USB connection device, and the like, are interconnected to one another (e.g., peripheral component interconnection (PCI), USB, firmware [IEEE 1394], an optical bus structure, a network, and the like).

The computing environment may be implemented as a distributed computing environment including a personal computer, a server computer, a handheld or laptop device, a mobile device (e.g., a mobile phone, a PDA, a media player, and the like), a multi-processor system, a consumer electronic device, a mini-computer, a mainframe computer, the aforementioned random system or device, but the computing environment is not limited thereto.

According to the examples, a normal operational state may be reached swiftly by using a relatively high warm up current without performing temperature compensation in the initial start period PT1, and in the normal driving period PT2 subsequently, a normal operation may be performed by using a bias current lower than the warm up current while performing temperature compensation. Accordingly, linearity may be improved.

By using a single current source and switching branching routes of a single reference current, the normal driving period may be reached swiftly using a high warm up current in the initial start period. Accordingly, the time when the bias circuit is warmed up may be accurately controlled in a simplified manner.

According to the examples, a bias circuit and a power amplifier improves linearity, and are capable of swiftly reaching a normal driving state using a relatively high warm up current without performing temperature compensation in an initial driving period PT1, and in a subsequent normal driving period PT2, a normal operation is performed using a bias current lower than the warm up current while performing temperature compensation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit, comprising:
    a current source configured to generate a reference current;
    a temperature compensation portion configured to be in an off-state in an initial start period in response to a first control signal, and to be in an on-state in a normal driving period, subsequent to the initial start period, and to receive a first current lower than the reference current; and
    a bias output portion configured to receive the reference current and to generate a warm up current based on the reference current in the initial start period, and to receive a second current, which is lower than the reference current by an amount of the first current, and to generate a bias current based on the second current in the normal driving period,
    wherein the temperature compensation portion comprises:
        a temperature compensation circuit connected between a first node, an output stage of the current source, and a first ground; and
        a first switch connected between the first node and the temperature compensation circuit, and configured to be in an off-state in the initial start period in response to the first control signal and to be in an on-state in the normal driving period, and
    wherein the bias output portion comprises:
        a bias output circuit connected between the first node and a power amplifier circuit; and a second switch connected between the first node and the bias output circuit, and configured to be in an on-state in the initial start period and in the normal driving period in response to a second control signal.

2. The bias circuit of claim 1, wherein the bias output circuit comprises a bias transistor including a base connected to the second switch, a collector connected to an operational voltage terminal, and an emitter connected to the power amplifier circuit, the bias transistor configured to generate the warm up current in the initial start period and to generate the bias current in the normal driving period by amplifying a current input through the second switch, and to output the amplified current to an input node of the power amplifier circuit.

3. The bias circuit of claim 1, wherein the first current is input in the temperature compensation circuit in the normal driving period and the second current is input in the bias output circuit in the normal driving period, and the first current is higher than the second current.

4. A power amplifier, comprising:
   a bias circuit configured to generate a warm up current in an initial start period, and to generate a bias current in a normal driving period, subsequent to the initial start period; and
   a power amplifier circuit configured to be warmed up by receiving the warm up current, and to be driven by receiving the bias current,
   wherein the bias circuit comprises:
      a current source configured to generate a reference voltage;
      a temperature compensation portion configured to be in an off-state in the initial start period and to be in an on-state in the normal driving period, and to receive a first current lower than the reference current; and
      a bias output portion configured to receive the reference current and to generate the warm up current based on the reference current in the initial start period, and to receive a second current, which is lower than the reference current by an amount of the first current, and to generate the bias current based on the second current in the normal driving period,
   wherein the temperature compensation portion comprises:
      a temperature compensation circuit connected between a first node, an output stage of the current source, and a first ground; and
      a first switch connected between the first node and the temperature compensation circuit, and configured to be in an off-state in the initial start period in response to a first control signal and to be in an on-state in the normal driving period, and
   wherein the bias output portion comprises:
      a bias output circuit connected between the first node and the power amplifier circuit; and
      a second switch connected between the first node and the bias output circuit, and configured to be in an on-state in the initial start period and in the normal driving period in response to a second control signal.

5. The power amplifier of claim 4, wherein the bias output circuit comprises a bias transistor including a base connected to the second switch, a collector connected to an operational voltage terminal, and an emitter connected to the power amplifier circuit, the bias transistor configured to generate the warm up current in the initial start period and to generate the bias current in the normal driving period by amplifying a current input through the second switch, and to output the amplified current to an input node of the power amplifier circuit.

6. The power amplifier of claim 4, further comprising a control circuit configured to output the first control signal based on a system enable signal, the first control signal having a switching-on level in the initial start period, and configured to generate the second control signal, the second control signal having a switching-off level in the initial start period and a switching-on level in the normal driving period.

7. The power amplifier of claim 6, wherein the control circuit comprises:
   a buffer configured to output a second control voltage based on the system enable signal;
   a constant current source configured to generate a constant current;
   a capacitor circuit configured to charge an electric charge based on the constant current and to output a charging voltage; and
   a comparator configured to compare the charging voltage and a reference voltage and to output the first control signal having a level depending on a result of the comparison.

8. The power amplifier of claim 6, wherein the control circuit comprises:
   a first constant current source configured to generate a first constant current;
   a second constant current source configured to generate a second constant current;
   a first capacitor circuit configured to charge an electric charge based on the first constant current and to output a first charging voltage;
   a second capacitor circuit configured to charge an electric charge based on the second constant current and to output a second charging voltage;
   a discharge control circuit configured to compare the first charging voltage and a first reference voltage and to control an output shutdown and a discharge of the first constant current source and the second constant current source having a level depending on a result of the comparison of the first charging voltage and the first reference voltage;
   a discharge circuit configured to discharge the first capacitor circuit and the second capacitor circuit in response to a control of the discharge control circuit;
   a first comparison circuit configured to compare the first charging voltage and a second reference voltage and to output the first control signal having a level depending on a result of the comparison of the first charging voltage and the second reference voltage; and
   a second comparison circuit configured to compare the second charging voltage and the second reference voltage and to output the second control signal having a level depending on a result of the comparison of the second charging voltage and the second reference voltage.

9. A bias circuit, comprising:
   a current source configured to generate a reference current;
   a temperature compensation portion configured to be in an off-state in an initial start period in response to a first control signal, and to be in an on-state in a normal driving period, subsequent to the initial start period, and to receive a first current of the reference current; and
   a bias output portion configured to generate a warm up current based on the reference current in the initial start period, and to generate a bias current based on a second current, which is lower than the reference current by an amount of the first current, in the normal driving period, wherein the temperature compensation portion comprises:
  a temperature compensation circuit connected between a first node, an output stage of the current source, and a first ground; and
  a first switch connected between the temperature compensation circuit and the first ground, and configured to be in an off-state in the initial start period in response to the first control signal and to be in an on-state in the normal driving period, and wherein the bias output portion comprises:
  a bias output circuit connected between the first node and a power amplifier circuit; and
  a second switch connected between the bias output circuit and the power amplifier circuit, and configured to be in an on-state in the initial start period and in the normal driving period in response to a second control signal.

* * * * *